United States Patent [19]

Watanabe et al.

[11] Patent Number: 4,920,406
[45] Date of Patent: Apr. 24, 1990

[54] SEMICONDUCTOR DEVICE

[75] Inventors: Yoshio Watanabe, Kawasaki; Shinji Emori, Urawa, both of Japan

[73] Assignee: Fujitsu Limited, Kawasaki, Japan

[21] Appl. No.: 124,944

[22] PCT Filed: Feb. 6, 1987

[86] PCT No.: PCT/JP87/00079
§ 371 Date: Oct. 7, 1987
§ 102(e) Date: Oct. 7, 1987

[87] PCT Pub. No.: WO87/04855
PCT Pub. Date: Aug. 13, 1987

[30] Foreign Application Priority Data

Feb. 7, 1986 [JP] Japan ................ 61-024181

[51] Int. Cl.$^5$ ................ H01C 23/02; H01C 23/12
[52] U.S. Cl. ................ 357/74; 357/75; 357/70
[58] Field of Search ................ 357/74, 75, 68, 70, 357/51, 71, 80; 361/403, 418, 421

[56] References Cited

U.S. PATENT DOCUMENTS 4,534,105 8/1985 Reusch .................... 357/70
4,631,572 12/1986 Zimmerman .................... 357/75

FOREIGN PATENT DOCUMENTS

57-104235 6/1982 Japan .
0152047 7/1986 Japan .................... 357/74
8704855 8/1987 World Int. Prop. O. ............ 357/74

Primary Examiner—Rolf Hille
Assistant Examiner—Hoanganh Le
Attorney, Agent, or Firm—Staas & Halsey

[57] ABSTRACT

A semiconductor device provided with a pair of package leads with external ends respectively and electrically connected to a drive side transmission line and a terminating side transmission line, as package leads of an integrated circuit to which signals transmitted from a drive circuit are input, the internal ends of the pair of package leads being electrically connected through pads on the chip. The pads on the chip may be connected to the package lead connected to the drive side transmission line and the terminating resistor.

18 Claims, 11 Drawing Sheets

SEMICONDUCTOR DEVICE

TECHNICAL FIELD

The present invention relates to a semiconductor device, more particularly to a semiconductor device wherein a large number of high-speed integrated circuits (high-speed ICs) comprising of high-speed digital signal logic circuits are mounted on a printed circuit board.

BACKGROUND ART

In general, in this kind of semiconductor device, when the integrated circuits mounted on the printed circuit board are high-speed ICs, it is necessary to consider impedance matching at various points on transmission lines printed on the printed circuit board so as to enable transmission of high-speed signals transmitted from drive side ICs (for example, signals changing from low level to high level at a high speed) to receiving side ICs in a manner such that the signal waveforms are not destroyed.

Figure 1:
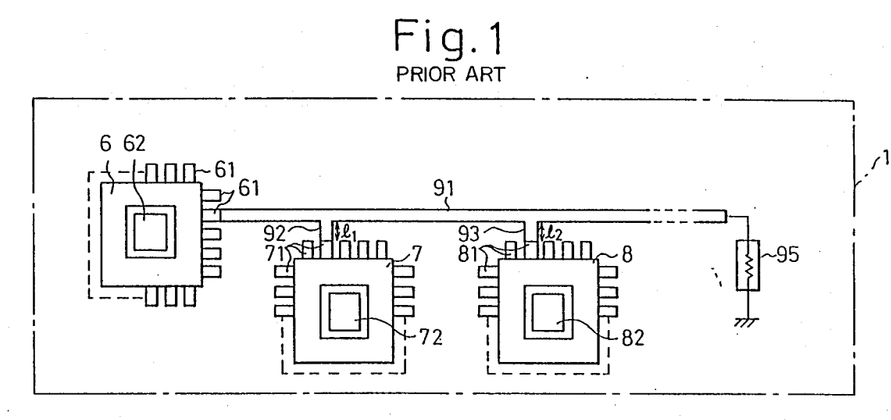
FIG. 1 shows the general concept of the constitution of a semiconductor device in the prior art.

FIG. 1 shows the concept of an example of this kind of semiconductor device in the prior art, wherein a single drive side IC 6 mounted on a printed circuit board 10 drives two receiving side ICs 7 and 8 (that is, there are two fan-outs). The high-speed signal transmitted from a package lead 61 (one of the package leads of the drive side IC 6) for signal output in the drive side IC 6 passes through a transmission line formed by a microstrip line 91 printed on the printed circuit board 10 to transmit the signal data successively to the receiving side ICs 7 and 8, and, finally, is absorbed by the terminating resistor 95 connected between the end of the transmission line and the ground.

In the figure, reference numeral 62 is a drive side IC chip, 71 and 72 are package leads and a chip of the receiving side IC 7, and 81 and 82 are package leads and a chip of the receiving side IC 8. Note that, in the figure, for brevity's sake, an example is shown of the connection of two receiving side ICs 7 and 8 to a line for transmitting high-speed signals transmitted from a single drive side IC 6. But in actuality, a large number of receiving side ICs will be connected to the transmission line and these receiving side ICs will in turn function as drive side ICs for ICs connected successively in cascade on the printed circuit board.

As shown in the figure, further, in the semiconductor device of the example of the prior art, when connecting the receiving side ICs 7 and 8 to the microstrip line 91 which serves as the transmission line (so-called trunk line), the microstrip lines 92 and 93 (that is, branched transmission lines) branched (as so-called incoming lines) from the microstrip line 91 are formed by printed wiring on the printed circuit board 10 in the same way as the microstrip line 91. The ends of these microstrip lines 92 and 93 are connected to package leads of the receiving side ICs 7 and 8, respectively, each of which package leads is one of the plurality of package leads of the receiving side ICs which acts as an input pin.

In particular, when these ICs are high-speed ICs, as mentioned above, when forming the transmission line by printed wiring on the printed circuit board, special consideration is given to impedance matching in the layout of the transmission line. In the above structure, the characteristic impedances $Z_0$ of each of the microstrip lines 91, 92, and 93 are all formed to be, for example, 50 ohms (the value of the characteristic impedance is determined based on the width of the printed wiring, the dielectric constant and the thickness of the insulator used for the printed circuit board, etc.) and the terminating resistor 95 is also formed to be 50 ohms.

In this construction, if the lengths of the microstrip lines 92 and 93, each branched from the microstrip line 91 and led into each of the receiving side ICs 7 and 8, are $l_1$ and $l_2$, respectively, when the degree of high speed of the signals transmitted through the same, as further clarified later, is within a range where the existence of the branched microstrip lines 92 and 93 each having the lengths of $l_1$ and $l_2$ are tolerable, there is no special problem in the transmission of the signals due to the construction of the above-mentioned example of the prior art. But, when the transmitted signals become higher in speed, it becomes impossible to neglect the existence of the branched microstrip lines 92 and 93 with regard to such high-speed signals, the existence thereof becomes the cause of mismatching of the transmission lines.

Figure 2:
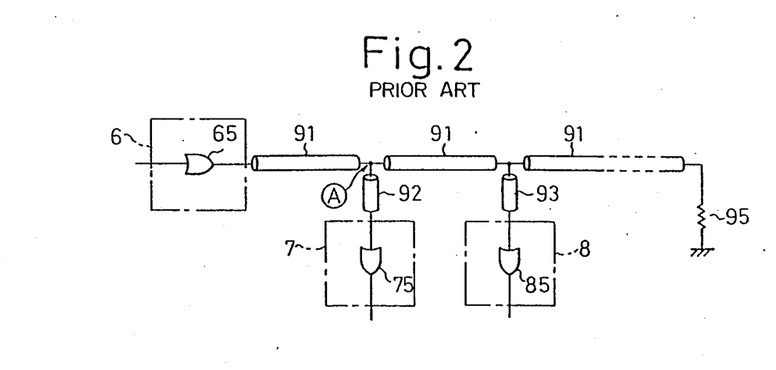
FIG. 2 shows an equivalent circuit of the device of FIG. 1.

Explaining this point further, FIG. 2 shows an equivalent circuit of the semiconductor device of the example of the prior art shown in the above-mentioned FIG. 1. For brevity's sake, the drive side IC 6 and the receiving side ICs 7 and 8 are comprised of one-input gates 65 and 75 and 85. Further, the input impedances of each of the receiving side ICs 7 and 8 are sufficiently high compared with the impedance of the transmission line (50 ohms). Reference numeral 95 shows a terminating resistor (50 ohms). The connection point of the transmission lines 91 and 92 is shown as point A.

Figure 3:
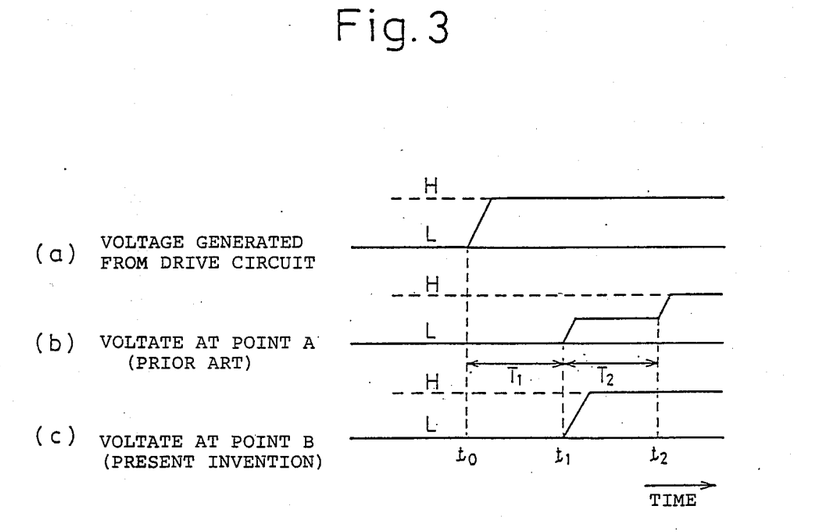
FIG. 3 is a waveform diagram for explaining differences in the signal waveforms transmitted in the semiconductor devices of the present invention and prior art.

Assume now that a voltage waveform signal which rises from the level L to the level H is transmitted at the time $t_0$ from the drive side IC 6, as shown in FIG. 3(a) and that the signal having this rising edge waveform reaches the branching point at the receiving side IC 7, that is, the above-mentioned point A, after the time $T_1$. If so, then the left-hand side of point A in FIG. 2 becomes a 50 ohm transmission line, and the right-hand side of point A becomes a 25 ohm transmission line (that is, the branched transmission line 92 (50 ohms) and the transmission line (50 ohms) on the right-hand side of point A (terminating resistor side) are connected in parallel), whereby at a time $t_1$ after time $T_1$, since the signal transmitted from the drive side IC is branched, the voltage of the point A only rises to the intermediate level of the level H of the transmitted signal.

Part of the signals passing through a microstrip line 92 having a length $l_1$ from point A to reach the receiving side IC 7, are reflected at the input side of the receiving side IC 7, and again pass through the microstrip line 92 having a length $l_1$ to return to point A. The signals are transmitted to the microstrip lines 91 and 92, but part of the signals are reflected again toward the microstrip line 92 by mismatching at the point A. The same is subsequently repeated.

In this way, the voltage waveform of point A has an intermediate level portion over a time corresponding to the time $T_2$ where part of the signals travel back and forth over the microstrip line 92 (that is, pass over the $2l_1$ length of transmission line), as shown in FIG. 3(b). In particular, the time $T_2$ during which the intermediate level is exhibited cannot be ignored for high-speed signals with a fast rising time (acute rising edges) of the voltage waveform (for example, this can lead to a high level being mistaken as a low level and an erroneous operation). Of course, the smaller the value of $l_1$ (the shorter the length of the branched microstrip line 92), the shorter the time $T_2$ during which the intermediate level is exhibited can be made, but there are limits to how far printed wiring techniques can go even in shortening $l_1$. In particular, with high-speed signals with an acute rising edge (or trailing edge) such as mentioned above, there is the problem in that the disturbance in the signal waveform due to the branched microstrip line 92, that is, the line used as the incoming line to the receiving side IC 7 (that is, the branched transmission line) cannot be ignored.

Note that, although reference above was made to the branch connected microstrip line 92 with respect to the receiving side IC 7, it is clear that a similar problem exists with the branch connected microstrip line 93 with respect to the other receiving side IC 8.

Figure 4:
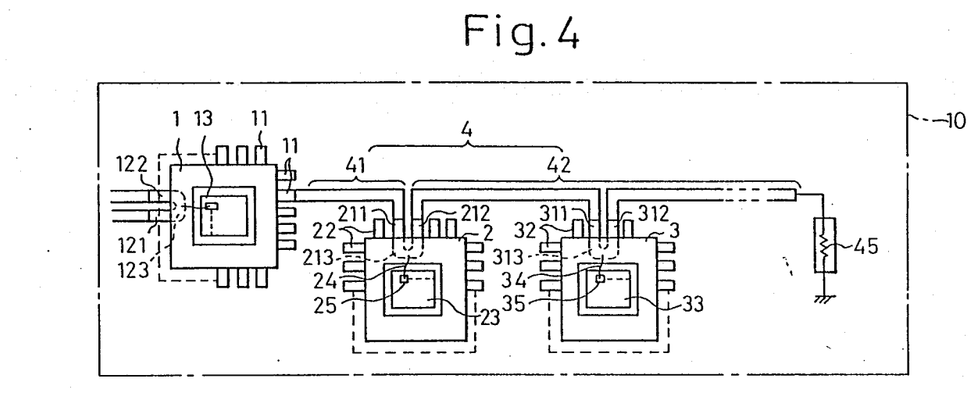
FIG. 4 shows the general concept of the constitution of an existing semiconductor device.

To solve the above problems, the present applicant previously proposed, as shown in FIG. 4, a semiconductor device wherein the package leads of a receiving side IC (for example, indicated by the symbol 2) to which signals transmitted from the drive side IC 1 are input are comprised of a pair of external leads 211 and 212 and an internal lead 213 connecting the pair of external leads 211 and 212 inside the package and wherein the pair of external leads 211 and 212 are connected respectively to the drive side transmission line 41 and terminating side transmission line 42 (see Japanese Unexamined Patent Publication (Kokai) No. 61-152047).

Note that FIG. 4 shows the case of a single drive side IC 1 mounted on a printed circuit board 10 driving two receiving side ICs 2 and 3 and that, at the receiving side IC 3 also, the package leads are comprised of the aforementioned external leads 311 and 312 and internal lead 313. The pair of external leads 311 and 312 are connected respectively, seen from the receiving side IC 3, to the drive side transmission line and terminating side transmission line. Note that, in the figure, at the receiving side IC 2, 22 denotes package leads other than the above-mentioned package leads for signal input (for example, package leads for connection to the power source or for signal output), 23 is a chip, 25 is a pad provided on the chip 23, and 24 is a wire connecting the internal lead 213 and pad 25. Further, at the receiving side IC 3, there are provided package leads 32 like the above-mentioned package leads 22, a chip 33, a pad 35, and a wire 34. Further, the drive side IC 1 in some cases acts as a receiving side IC with respect to the drive side IC of the former stage. In such a case, package leads to which signals from the drive side IC of the preceding stage are input are comprised of a pair of external leads 121 and 122 and an internal lead 123 connecting these external leads inside the package.

Figure 5:
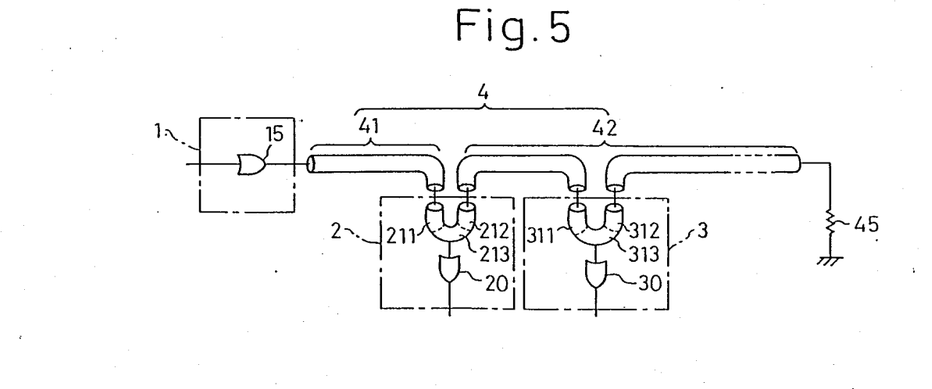
FIG. 5 shows an equivalent circuit of the device of FIG. 4.

FIG. 5 shows an equivalent circuit of the semiconductor device shown in the above-mentioned FIG. 4, wherein the drive side IC 1 and the receiving side ICs 2 and 3 are shown as comprised of one-input gates 15, 20, and 30. The high-speed signals transmitted from a package lead 11 of the drive side IC 1 pass through a transmission line comprised of the microstrip line 4 printed on the printed circuit board 10. The signal information is transmitted successively to the receiving side ICs 2 and 3 through the package leads (211, 213, 212; 311, 313, 312) and the signals are finally absorbed at a terminating resistor 45 (for example, 50 ohms) connected between the end of the transmission line 4 and ground. The characteristic impedance $Z_0$ of the microstrip line comprising the transmission line 4 is formed as, for example, 50 ohms. Further, in this case, the impedances of the package leads connected to the transmission line (211, 213, 212; 311, 313, 312) are formed as 50 ohms in consideration of the impedance matching with the transmission line.

It has been considered that, by making the construction in this way, the disturbances in the signal waveform can be eliminated even with high-speed signals with acute rising edges by making the transmission line including the package leads of the receiving side ICs a impedance-matched line.

However, even with a semiconductor device of such a structure, the intervals between the above-mentioned internal leads 213 and 313 and the pads 25 and 35 provided on the IC chips 23 and 33 are connected by wires 24 and 34, respectively. Therefore, the portions after the connection point of the internal leads 213 and 313 and the wires 24 and 34 become the above-mentioned branched transmission lines, and there is still a possibility of mismatching due to the existence of such branched transmission lines. Depending on the degree of speed of the high-speed signals, disturbances may still occur in the signal waveform and stable operation cannot be ensured, so problems still remain.

SUMMARY OF THE INVENTION

The present invention was made in order to solve the above-mentioned problems, and is based on the idea of minimizing the branched transmission lines number of from the transmission line serving as a so-called "trunk line" that form so-called "incoming" lines connected to circuit elements of the receiving side ICs and leading in succession to the "trunk line" transmission line as it is up to the chips provided on the receiving side IC packages. This eliminates the trouble of forming the "incoming line" transmission lines, and further eliminates the disturbances in the signal waveform even with superhigh-speed signals with acute rising edges by making the overall transmission line an impedance-matched line. This enables a stabilization of the operation of superhigh-speed ICs.

To solve the above problems, according to the present invention, there is proposed a semiconductor device provided with a pair of package leads with external ends electrically connected to a drive side transmission line and a terminating side transmission line, as package leads of an integrated circuit to which signals transmitted from a drive circuit are input, the internal ends of the pair of package leads being electrically connected to pads on the chip. When the integrated circuit is at the final stage when viewed from the drive circuit, the pads on the chip have connected thereto a package lead connected to the drive side transmission line and a terminating resistor.

According to the above construction, signals transmitted from a drive circuit through a drive side transmission line successively pass through one of the package leads of the pair provided at the receiving side integrated circuit, the pad on the chip, and the other of the package leads of the pair connected to the pad and then pass through the terminating side transmission line connected to the other package lead to be successively transmitted to the succeeding integrated circuits. Further, in the case of the final stage integrated circuit as seen from the drive circuit, the pads on the chip have connected thereto a terminating resistor instead of another package lead.

In this case, the overall transmission line which reaches the receiving side IC chip is made an impedance-matched line. Even if the signals transmitted by the line are superhigh-speed signals with acute rising edges, there is no disturbance at all in the waveform. It is therefore possible to stably operate the receiving side ICs, and there is no longer any chance of an erroneous operation.

DESCRIPTION OF THE PREFERRED EMBODIMENTS

Figure 6:
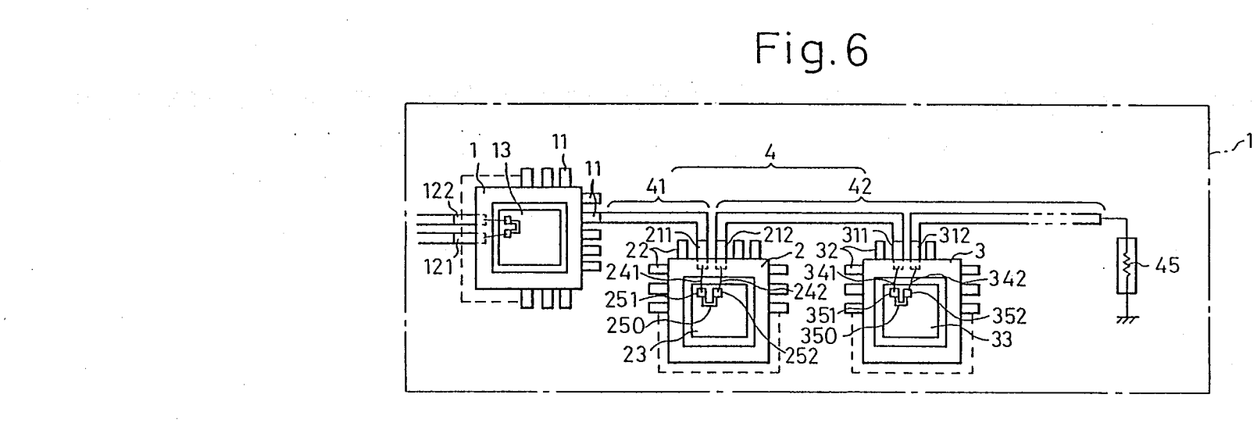
FIG. 6 shows the general concept of the constitution of a semiconductor device according to an embodiment of the present invention.

FIG. 6 shows the general concept of an example of a semiconductor device according to an embodiment of the present invention. A single drive side IC 1 is mounted on a printed circuit board 10 driving two receiving side ICs 2 and 3. The high-speed signals transmitted from a package lead 11 (one of the package leads of the drive side IC 1) of the drive side IC 1 pass through the transmission line comprised of the microstrip line 4 printed on the printed circuit board 10 to transmit the signal information successively to the receiving side ICs 2 and 3. The signals are finally absorbed at a terminating resistor 45 (50 ohms) connected between the end of the transmission line 4 and the ground. Note that in the FIG. 13, 23, and 33 show chips of the ICs 1, 2, and 3, respectively.

Further, 211 and 212 are a pair of package leads with external ends connected to the transmission line 41 on the drive side and the transmission line 42 on the terminating side, seen from the receiving side IC 2. The pair of package leads 211 and 212 are connected at their internal ends to ends of bonding wires 241 and 242, respectively. The other ends of the bonding wires 241 and 242 are connected to a pair of pads 251 and 252 provided on the chip 23. Further, the pair of pads 251 and 252 are directly connected electrically by a connection 250 having a folded back portion. Reference numeral 22 shows package leads at the receiving side IC 2 other than the package leads 211 and 212 used for signal input (for example, package leads for connection to the power source or for signal output).

In the same way, 311 and 312 are a pair of package leads connected respectively to the transmission line on the drive side and the transmission line on the terminating side, seen from the above-mentioned receiving side IC 3. The pair of package leads 311 and 312 are connected at their internal ends to a pair of pads 351 and 352 provided on the chip 33 via bonding wires 341 and 342, respectively. The pair of pads 351 and 352 are connected electrically by a connection 350 having a folded back portion. When the receiving side IC 3 is the last stage IC, the package lead 312 is connected directly to the terminating resistor 45.

Figure 15:
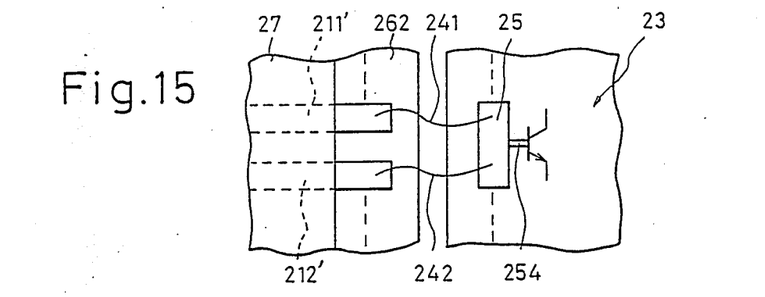

Note that even in the case of the drive side IC 1, there are cases in which it acts as a receiving side IC with respect to the drive side IC of the previous stage. In such a case, the pair of package leads to which signals from the drive side IC of the preceding stage are input are indicated by 121 and 122. Note that instead of using the above-mentioned pair of pads (for example, 251 and 252) as the pads to which the above-mentioned pair of package leads are connected, use may be made of a common pad as shown by FIG. 15.

The present invention is characterized by the provision, as package leads of the receiving side IC to which signals transmitted from the drive side IC are input through a transmission line, of a pair of package leads with external ends connected respectively to the transmission line on the drive side and the transmission line on the terminating side, seen from the receiving side IC. The internal ends of the pair of package leads are connected to pads on the chips (when the receiving side IC is the final stage IC, the pads on the chip have connected thereto the package lead connected to the drive side transmission line and the terminating resistor), whereby a transmission line free of branches is formed up to the chip provided in the package of the receiving side IC.

Figure 7:
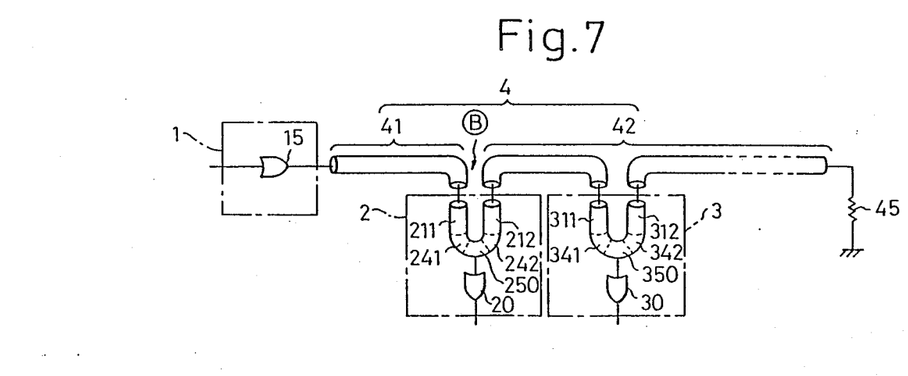
FIG. 7 shows an equivalent circuit of the device of FIG. 6.

FIG. 7 shows an equivalent circuit of the semiconductor device shown n the above-mentioned FIG. 6. For brevity's sake, the drive side IC 1 and the receiving side ICs 2 and 3 are shown formed by the one-input gates 15, 20, and 30, respectively.

The characteristic impedance $Z_0$ of the microstrip line comprising the transmission line 4 is formed at, for example, 50 ohms. Further, in this case, the impedances of the pair of package leads connected to the transmission line, and further, the impedances of the bonding wires connecting the pair of package leads to the pads on the chip, respectively, also may be made about 50 ohms in consideration of the impedance matching with the transmission line.

By the above construction, the overall transmission line running up to the chips inside the receiving side ICs becomes an impedance-matched line, whereby all disturbances are eliminated in the waveforms of signals transmitted by the line even when the signals are super-high-speed signals with acute rising edges (for example, the voltage waveform of point B corresponding to point A in FIG. 2 becomes as shown in FIG. 3(C)). Accordingly, it is possible to stably operate the receiving side ICs (for example, prevent oscillation) and to secure faster operational speeds and accuracy.

Figure 8:
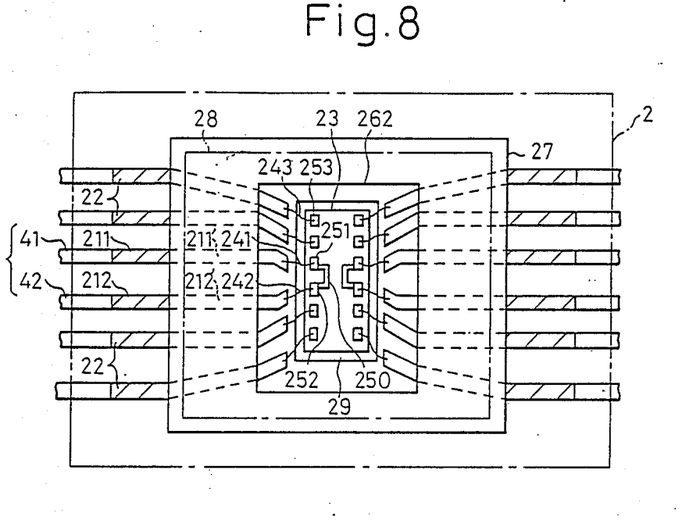
FIG. 8 is a plan view showing further details of the example of mounting of a receiving side IC in the device of FIG. 6.
Figure 9:
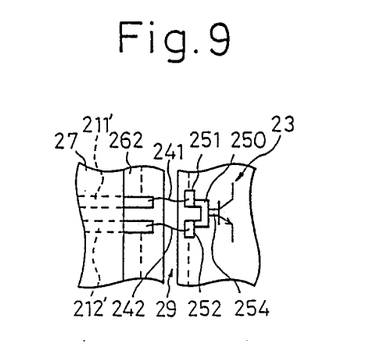
FIG. 9 is an enlarged plan view of key parts of FIG. 8.
Figure 10:
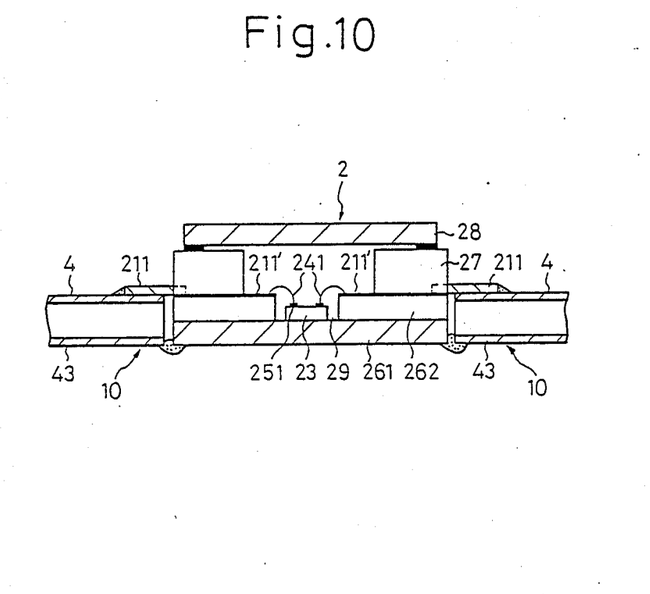
FIG. 10 is a longitudinal sectional view of the receiving side IC shown in FIG. 8.

FIG. 8 to FIG. 10 (FIG. 9 being an enlarged view of key portions of FIG. 8) show in further detail an example of the state of mounting in the receiving side ICs. FIG. 10 shows the mounting of a receiving side IC 2 on a printed circuit board 10.

Referring to FIG. 10, the package of the receiving side IC 2 is comprised of a metal base 261, a bottom frame 262 and top frame 27 formed by a conventional ceramic, and a cover 28. The IC chip 23 is mounted in a cavity 29. On the other hand, a microstrip line 4 serving as a transmission line is formed by printed wiring on the printed circuit board 10. On the reverse side of the printed circuit board 10 is formed a ground side metal surface 43.

As the package leads for signal input, which receive as input signals transmitted from the transmission line 4, there are provided the pair of package leads 211 and 212 with external ends connected to the transmission line 41 on the drive side and the transmission line 42 on the terminating side, respectively, as mentioned above. In this case, the portions of the pair of package leads 211 and 212 existing in the package (internal leads) 211' and 212' (FIG. 10) are formed as metal layers (metal patterns) on the bottom frame 262. On the other hand, the portions of the pair of package leads 211 and 212 (e.g., FIG. 8) existing outside of the package (external leads) are formed by lead lines, the two ends of which are soldered to the microstrip line 4 and the internal leads 211' and 212', respectively. These internal leads and external leads may be suitably comprised by pins, metal patterns, lead lines, etc., and of course, may together comprise one unit.

The internal leads 211' and 212' (e.g. FIGS. 8 and 10) have connected to their internal ends the ends of the bonding wires 241 and 242, respectively. The other ends of the bonding wires 241 and 242 are connected to the pair of pads 251 and 252 provided on the chip 23. Further, the pair of pads 251 and 252 are directly and electrically connected by a connection line 250 (FIG. 9) having a folded back portion.

Note that the package leads 22 (FIG. 8) other than the so-called signal input package leads to which signals from the transmission line are input (for example, the package leads for connection to the power source or for signal output) are comprised, as in the prior art, by a single external lead and an internal lead. The package leads 22 are connected via the bonding wire 243 to predetermined pads 253 on the chip.

Figure 11:
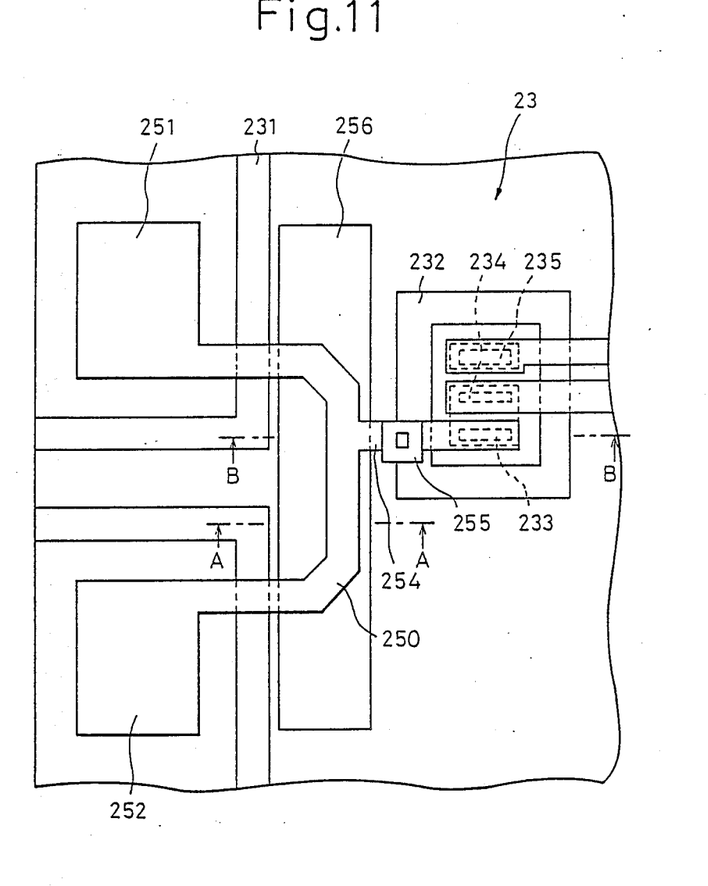
FIG. 11 is a plan view showing an example of the pattern of the chip input portion shown in FIG. 9.
Figure 12:
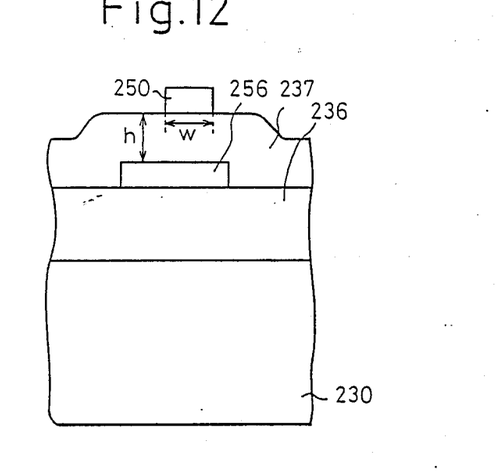
FIG. 12 is a sectional view along line A—A in FIG. 11.
Figure 13:
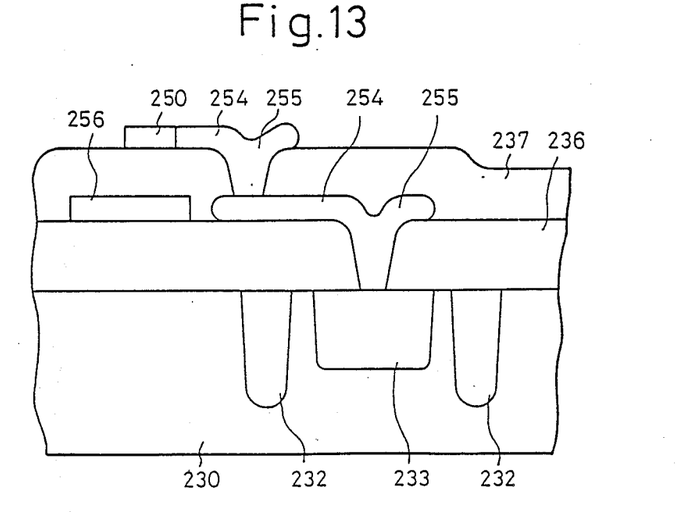
FIG. 13 is a sectional view along line B—B of FIG. 11.

FIG. 11 is a plan view showing in detail an example of a pattern of a chip input portion including the pattern of active element (transistor) connected to the pads 251 and 252 on a chip 23 shown in FIG. 9. FIG. 12 and FIG. 13 are sectional views along the lines A—A and B—B, respectively. In the example shown by FIG. 11 to FIG. 13, the connection line 250 connecting the pair of pads 251 and 252 is formed as a microstrip line having a characteristic impedance (in this case, 50 ohms) equal to the characteristic impedance of the transmission line.

For this reason, on a first insulating film 236 formed on a silicon substrate 230, a ground pattern 256 is formed at the portion located under the connection line 250. A second insulating film 237 is formed on the ground pattern 256 and the connection line (signal line) 250 is formed on top of that. In this case, by making, for example, the dielectric constant of the insulating film 237 between the connection line 250 and the ground pattern 256 4 and its thickness h 2 microns, and making the width w of the connection line 250 4 microns, the characteristic impedance of the microstrip line used as the connection line 250 can be made 50 ohms. Note that in FIG. 11, 231 and 232 indicate isolation regions, 233 a base diffusion region of the transistor, 234 an emitter diffusion region, and 235 a collector diffusion region. Further, as shown by the sectional view of FIG. 13, the lines 254 connecting the connection line 250 and active element (in this case the base diffusion region 233 of the transistor) are connected through through hole contacts 255 formed in the insulating films 237 and 236 to the base diffusion region 233 of the transistor.

In the above-mentioned example, to set the characteristic impedance of the connection line 250 to a predetermined value (in this case, 50 ohms), a ground pattern 256 is formed by aluminum or another metal or polycrystalline silicon etc. in the insulating film under the connection line 250, but in another example, it is possible to omit the ground pattern 256, set the silicon substrate 230 itself to the ground potential (for this, for example, it may be considered to form a predetermined impurity region on the surface of the silicon substrate 230 under the connection line 250 and make the impurity region the ground potential), and set the width of the connection line 250 and the thickness of the insulating film between the connection line 250 and the silicon substrate 230 to an appropriate value, whereby it is possible to make the connection line 250 a microstrip line having a predetermined characteristic impedance (in this case, 50 ohms).

Figure 14:
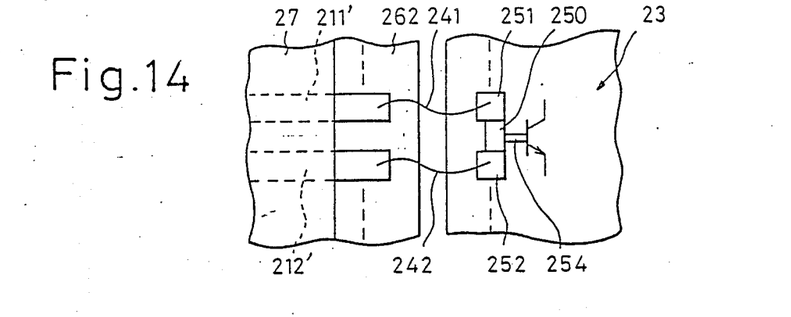
FIG. 14, FIG. 15, and FIG. 16 are plan views showing modifications of portions shown in FIG. 9.

Further, FIG. 14 shows an example of a pattern in the case of formation of the connection line 250 connecting the above-mentioned pair of pads 251 and 252 without consideration of the matching of the characteristic impedance with the said transmission line. This is applied in the case where, as shown in said FIG. 14, the connection lines 250 and 254 are shorter in length and it is possible to ignore the effects of the connection line 250 in the ICs used.

FIG. 15 shows an example of a pattern in the case where the pair of pads 251 and 252, to which are connected the pair of bonding wires 241 and 242 stretching from pair of internal leads 211' and 212', are formed as a single common pad 25. In this case too, there is a similar function as in the case of formation of the above-mentioned pair of pads.

Note that in the present invention also, the connection line 250 or the connection line 254 for connecting the above-mentioned common pad 25 and active element (for example, transistor) formed in the chip 23 is necessary, but as mentioned above, by taking the transmission line as it is to the chips provided in the package of the receiving side ICs, it is possible to make the connection line 254 as short as minimally necessary and the effects can be ignored even with a superhigh-speed IC used in the present invention.

Figure 16:
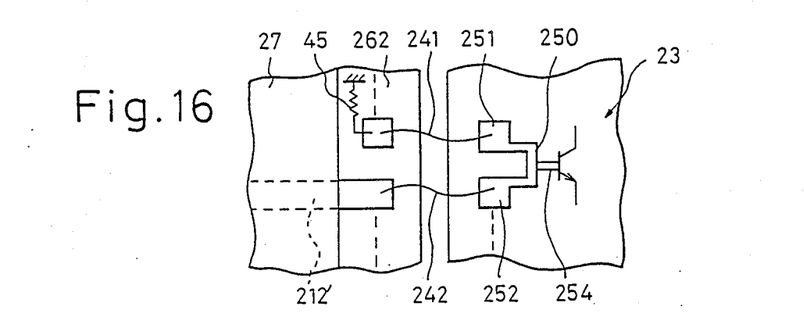

As mentioned above, when the receiving side IC to which the present invention is applied is a final stage IC as seen from the drive circuit, the pads on the chip have connected thereto the package lead connected to the drive side transmission line and the terminating resistor. In this case, as shown in FIG. 16, the terminating resistor 45 may be formed on, for example, the frame 262 in the package as a thin film resistor or chip resistor connected with the pad 251, for example, via the bonding wire 241. Further, the thin film resistor or chip resistor serving as the terminating resistor 45 connected with the above-mentioned pad 251 may be formed on the package surface using the surface of the cover 28, etc., for example.

Figure 17:
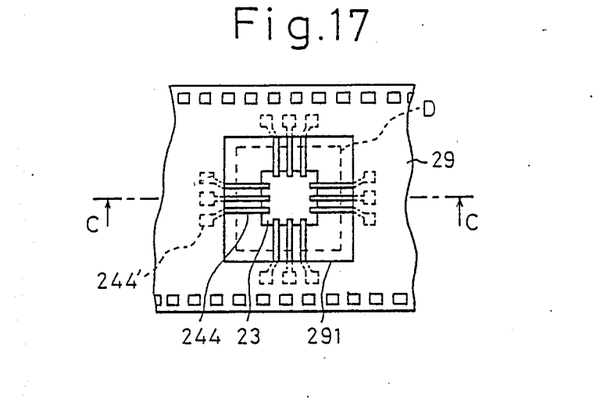
FIG. 17, FIG. 18, and FIG. 19 are views explaining the manufacturing process in the case of using tab lead bonding for the semiconductor device to which the present invention is applied.
Figure 18:
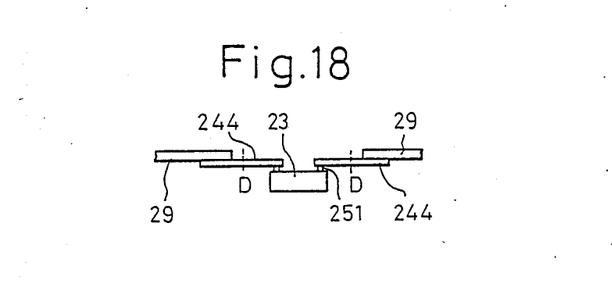
Figure 19:
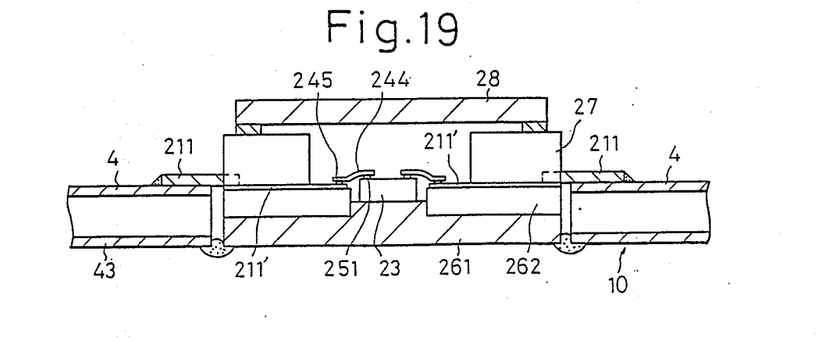

FIG. 17, FIG. 18, and FIG. 19 show the manufacturing process of a semiconductor device to which the present invention is applied, in the case of tab lead bonding. First, as shown in FIG. 17, a predetermined metal layer is covered on a resin film 29. The metal layer is etched, whereby a predetermined pattern of leads (tab leads) 244 is formed. Next, a predetermined opening 291 is formed in the resin film 29. FIG. 18 shows a sectional view along line C—C of FIG. 17. As clearly shown in FIG. 18, one end of each of the tab leads 244 is connected to a pad (for example, 251) on the chip 23. Tests, etc., on the IC chip 23 may be performed through the other ends 244' of the tab leads 244. Next, the tab leads 244 are cut along the dotted line D shown in FIG. 17 and FIG. 18. The chip 23 with the tab leads 244 produced in this way is adhered to the mounting position (for example, the metal base 261) of the package, as shown by FIG. 19. Further, the end portions of the cut side of the tab leads 244 are connected to the internal leads (for example, 211') formed in the package by tin or tin-lead alloy 245.

Figure 20:
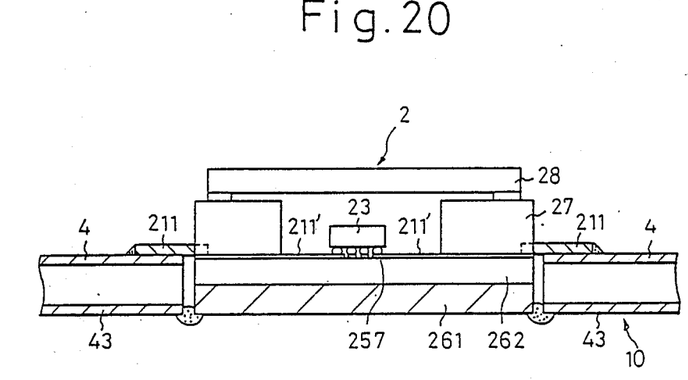
FIG. 20 and FIG. 21 are views showing the constitution in the case of use of bonding by bumps for the semiconductor device to which the present invention is applied.
Figure 21:
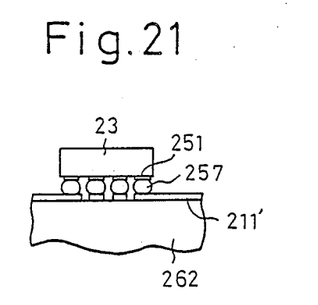

FIG. 20, and the enlarged view of key portions of the same in FIG. 21, show the constitution of a semiconductor device to which the present invention is applied in the case of bump bonding. The pads (for example, 251) formed by, for example, gold, on a chip 23 have formed thereon bumps 257 of, for example, a tin-lead alloy. The internal leads formed on the package frame 262 (for example, 211') and the IC chip 23 are connected by the bumps 257.

It is clear that the present invention can be used even in a semiconductor device using tab lead bonding or bump bonding. The internal ends of the pair of package leads connected at their external ends to the drive side transmission line and the terminating side transmission line are connected to the pads on the chip. When the IC chip is at the terminating stage when seen from the drive circuit, the internal end of the package lead connected to the drive side transmission line and the terminating resistor are connected to the pad on the chip.

According to the present invention, the branched transmission lines branched from the "trunk line" transmission line and led into the receiving side ICs can be minimized (that is, as shown by FIG. 9 and FIG. 14 to FIG. 16, to only the connection lines 250 connecting pairs of pads or the minimal connection line 254 for connecting the common pad 25 and active element (for example, transistor) on the integrated circuit), so it is possible to easily mount an IC on a printed circuit board without having to consider shortening the branched transmission lines.

Further, according to the present invention, it is possible to make the overall transmission line reaching the chip inside the receiving side IC an impedance-matched line, and thus, even when the signals transmitted by the line are superhigh-speed signals with acute rising edges, disturbances in the waveforms and erroneous operation of the superhigh-speed IC are eliminated, and thus also enable stabler, faster operations.

By way of reference, if the rising time or falling time of the input pulse transmitted by this type of transmission line is t, then $t \gg 2 \times (l_1 + l_2)/v_s$ (wherein $l_1$ is the wire bonding length, $l_2$ is the chip internal wiring, and $v_s$ is the speed of transmission of the electric signals).

Here, as a condition for ignoring the effects on the waveform characteristics, it is necessary to make the $(l_1 + l_2)$ of the above-mentioned equation sufficiently small. However, in current production, in general, the relationship $l_1 \gg l_2$ stands. It is extremely important to eliminate the wire bonding length $l_1$ to draw out the full performance of the IC.

As one example, when $l_1 = 2$ mm, $l_2 = 0.2$ mm, and $v_s = 1 \times 10^8$ m/sec, between the case where the wire bonding length $l_1$ has an effect, as in the above-mentioned preceding art, and the case where the wire bonding length $l_1$ does not have an effect and consideration is given to just the chip internal wiring $l_2$ (corresponding to the above-mentioned connection line 254), as in the present invention, there is an approximately 11:1 ratio between the above-mentioned times t, so the operation of the superhigh-speed IC is considerably improved.

We claim:

1. A semiconductor devices operatively connectable to a drive side transmission line and a to a terminating side transmission line, comprising:
   a pair of package leads each with an external end and an internal end, the external end of one of said package leads being electrically connectable to the drive side transmission line and the external end of another one of said package leads being electrically connectable to the terminating side transmission line;
   an integrated circuit chip having pads, the internal ends being electrically connected to said integrated circuit chip through at least one of said pads; and
   a pair of conductors each having first and second ends, the first ends are respectively connected to said pair of package leads and the second ends are connected to at least one of said pads, the internal ends are electrically connected together via said pair of conductors and at least one of said pads.

2. A semiconductor device according to claim 1 wherein the second ends of said pair of conductors are respectively electrically connected to a pair of said pads on said integrated circuit chip, and
   wherein said device further comprises a connection line, said pair of pads are electrically connected with each other on said integrated circuit chip through said connection line.

3. A semiconductor device according to claim 2, wherein said pair of package leads have a characteristic impedance that is equal to a characteristic impedance of said drive side and terminating side transmission lines.

4. A semiconductor device according to claim 3, wherein said connection line has a characteristic impedance that is equal to the characteristic impedance of said drive side and terminating side transmission lines.

5. A semiconductor device according to claim 4, further comprising:
   an insulating film; and
   a grounding pattern formed on said insulating film and under said connection line.

6. A semiconductor device according to claim 4, further comprising:
   a silicon substrate region under said connection line said substrate having a ground potential.

7. A semiconductor device according claim 1, wherein the second ends of said pair of conductors are electrically connected through a command pad.

8. A semiconductor device according to claim 7, wherein said pair of package leads have a characteristic impedance that is equal to a characteristic impedance of said drive side and terminating side transmission lines.

9. A semiconductor device operatively connectable to a drive side transmission line, comprising:
- a package lead having an external end, electrically connected to the drive side transmission line, and an internal end;
- a chip, having pads positioned thereon, one of said pads being electrically connected to said internal end of said package lead;
- a first conductor for electrically connecting said package lead and said one of said pads;
- a terminating resistor electrically connected to the internal end through said one of said pads; and
- a second conductor for electrically connecting said chip to said terminating resistor.

10. A semiconductor device according to claim 9, wherein the internal end of said package lead and said terminating resistor are electrically connected through said first and second conductors and respective ones of said pads, and wherein said device further comprises:
- a connection line electrically connecting said respective ones of said pads.

11. A semiconductor device according to claim 9, wherein the internal end of said package lead and said terminating resistor are electrically connected through a common one of said pads.

12. A semiconductor device according to claim 11, wherein said package lead and said terminating resistor have characteristic impedances equal to a characteristic impedance of said drive side transmission line.

13. A semiconductor device according to claim 9, wherein said terminating resistor is formed in an integrated circuit package.

14. A semiconductor device according to claim 9, wherein said terminating resistor is formed on a surface of an integrated circuit package.

15. A semiconductor device according to claim 9, wherein said package lead and said terminating resistor have characteristic impedances equal to a characteristic impedance of said drive said transmission line.

16. A semiconductor device according to claim 15, wherein said connection line has a characteristic impedance equal to a characteristic impedance of said drive side transmission line.

17. A semiconductor device according to claim 16, further comprising:
- an insulating film; and
- a grounding pattern formed on said insulating film and under said connection line.

18. A semiconductor device according to claim 16, further comprising:
- a silicon substrate region under said connection line said substrate having a ground potential.

* * * * *

UNITED STATES PATENT AND TRADEMARK OFFICE
CERTIFICATE OF CORRECTION

PATENT NO. : 4,920,406
DATED : April 24, 1990
INVENTOR(S) : Yoshio Watanabe et al.

It is certified that error appears in the above-identified patent and that said Letters Patent is hereby corrected as shown below:

Col. 11, line 3, "command" should be --common--.

Signed and Sealed this

Ninth Day of July, 1991

Attest:

HARRY F. MANBECK, JR.

Attesting Officer

Commissioner of Patents and Trademarks